United States Patent
Butzmann

(10) Patent No.: US 9,465,082 B2
(45) Date of Patent: Oct. 11, 2016

(54) DEVICE AND METHOD FOR MEASURING A MAXIMUM CELL VOLTAGE

(75) Inventor: Stefan Butzmann, Beilstein (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 162 days.

(21) Appl. No.: 14/233,746

(22) PCT Filed: Jul. 9, 2012

(86) PCT No.: PCT/EP2012/063353
§ 371 (c)(1),
(2), (4) Date: Apr. 24, 2014

(87) PCT Pub. No.: WO2013/010834
PCT Pub. Date: Jan. 24, 2013

(65) Prior Publication Data
US 2014/0234678 A1    Aug. 21, 2014

(30) Foreign Application Priority Data
Jul. 19, 2011    (DE) .......................... 10 2011 079 360

(51) Int. Cl.
*G01R 31/36*    (2006.01)
*G01R 19/10*    (2006.01)
(Continued)

(52) U.S. Cl.
CPC ........ *G01R 31/3627* (2013.01); *B60L 11/1861* (2013.01); *G01R 19/10* (2013.01); *G01R 31/362* (2013.01); *G01R 31/3658* (2013.01); *H01M 10/48* (2013.01); *G01R 1/203* (2013.01)

(58) Field of Classification Search
CPC ................................................ G01R 31/3658
See application file for complete search history.

(56) References Cited

U.S. PATENT DOCUMENTS 5,646,503 A * 7/1997 Stockstad ............. H02J 7/0022
                                                                320/135
5,982,050 A * 11/1999 Matsui .................. H02J 7/0016
                                                                307/10.7
(Continued)

FOREIGN PATENT DOCUMENTS

CN              1293370 A       5/2001
DE    10 2006 033 171 A1       1/2008
(Continued)

OTHER PUBLICATIONS

Atsushi,Imai and Hiroshi, Tamura—Abnormality detecting device of Battery pack, Jun. 29, 2011—Abstract Translation.*
(Continued)

*Primary Examiner* — Drew A Dunn
*Assistant Examiner* — Tynese McDaniel
(74) *Attorney, Agent, or Firm* — Maginot, Moore & Beck LLP

(57) ABSTRACT

A device for measuring a maximum cell voltage among cell voltages of a plurality of battery cells connected in series includes a plurality of ohmic resistors connected in series. The device is configured to be connected to a plurality of battery cells connected in series in such a way that a respective battery cell is associated with each ohmic resistor according to the series connections. Each ohmic resistor, with the exception of a first ohmic resistor, is configured to conduct the larger of (i) a current that corresponds to the cell voltage of the associated battery cell, and (ii) the current that is conducted by the preceding ohmic resistor in the series connection.

10 Claims, 4 Drawing Sheets

(51) Int. Cl.
*B60L 11/18* (2006.01)
*H01M 10/48* (2006.01)
*G01R 1/20* (2006.01)

(56) References Cited

U.S. PATENT DOCUMENTS

| | | | |
|---|---|---|---|
| 6,628,120 B1* | 9/2003 | Paul | G01R 31/3658 320/101 |
| 7,656,126 B2 | 2/2010 | Sato | |
| 2002/0195994 A1* | 12/2002 | Perelle | B60L 3/0046 320/116 |
| 2003/0111979 A1* | 6/2003 | Cheiky | H02J 7/0016 320/137 |
| 2004/0036446 A1* | 2/2004 | Iwashima | H02J 7/0016 320/116 |
| 2005/0024143 A1* | 2/2005 | Humphrey | H03F 1/22 330/255 |
| 2005/0127873 A1* | 6/2005 | Yamamoto | H02J 7/0016 320/116 |
| 2006/0103351 A1 | 5/2006 | Tanigawa | |
| 2009/0179650 A1* | 7/2009 | Omagari | G01R 31/3624 324/433 |
| 2010/0289497 A1* | 11/2010 | Lum-Shue-Chan | G01R 31/3658 324/426 |
| 2011/0012605 A1* | 1/2011 | Lyles | G01R 19/16542 324/433 |
| 2011/0018621 A1* | 1/2011 | Butzmann | G05F 3/262 327/543 |
| 2011/0089909 A1* | 4/2011 | Higashi | H02J 7/0016 320/166 |

FOREIGN PATENT DOCUMENTS

| | | | |
|---|---|---|---|
| DE | 10 2010 063 258 A1 | 6/2012 | |
| JP | 2001-174531 A | 6/2001 | |
| JP | 2001174531 * | 6/2009 | ......... G01R 31/3658 |
| JP | 2010515883 A | 5/2010 | |
| WO | 2012/079821 A1 | 6/2012 | |

OTHER PUBLICATIONS

Atsushi, Imai and Hiroshi, Tamura—Abnormality detecting device of Battery pack, Jun. 29, 2011—Description Translation.*
Atsushi, Imai and Hiroshi, Tamura—Abnormality detecting device of Battery pack, Jun. 29, 2011—Claims Translation.*
International Search Report corresponding to PCT Application No. PCT/EP2012/063353, mailed Nov. 26, 2012 (German and English language document) (7 pages).

* cited by examiner

DEVICE AND METHOD FOR MEASURING A MAXIMUM CELL VOLTAGE

This application is a 35 U.S.C. §371 National Stage Application of PCT/EP2012/063353, filed on Jul. 9, 2012, which claims the benefit of priority to Serial No. DE 10 2011 079 360.7, filed on Jul. 19, 2011 in Germany, the disclosures of which are incorporated herein by reference in their entirety.

The present disclosure relates to a device and a method for measuring the maximum cell voltage among the cell voltages of a multiplicity of series-connected battery cells, and to a battery management unit having such a device, to a battery having such a device or such a battery management unit and to a motor vehicle having such a battery.

BACKGROUND

It is likely that, in future, new battery systems on which very high demands in terms of reliability are placed will increasingly be used both in static applications, for example in wind power installations, and in vehicles such as hybrid and electric vehicles. The reason behind said high demands is that failure of the battery can lead to failure of the entire system or even to a safety-related problem. Thus, in wind power installations, for example, batteries are used in order to protect the installation against inadmissible operating states in a high wind by virtue of rotor blade adjustment.

Usually nowadays, lithium ion batteries involve the voltage of each cell being monitored individually, in order to be able to protect said cells from overloading during the charging process. Typically, a non-generic integrated circuit having multiplexers and analog/digital converters is used for this purpose, which integrated circuit communicates with a control unit. This solution is complex and expensive.

FIG. 1 illustrates the principle of such monitoring of an individual cell in accordance with the prior art. A battery management unit 10 comprises an integrated circuit 14 that is electrically connected to each of the battery cells 12a, 12b, ... 12n of a battery. The integrated circuit 14 comprises a multiplexer and an analog/digital converter and is connected to a control unit 18 by way of a communication bus 16.

A charging circuit for battery cells is known from DE 10 2006 033 171 A1, in which in each case a bypass is assigned to the individual battery cells, via which bypass a charging current is conducted to the individual battery cells depending on the charging state thereof. The charging process can be terminated if all of the battery cells or a predetermined number of battery cells have reached the maximum permissible voltage value thereof.

SUMMARY

The disclosure provides a device for measuring the maximum cell voltage among the cell voltages of a multiplicity of series-connected battery cells, wherein the device comprises a multiplicity of series-connected nonreactive resistors, wherein the device is connectable to a multiplicity of series-connected battery cells in such a way that a battery cell is assigned to each nonreactive resistor in accordance with the series connections, wherein a first nonreactive resistor, which precedes all of the other nonreactive resistors in the series connection, is designed to conduct a current which corresponds to the cell voltage of the assigned battery cell, and wherein each nonreactive resistor except the first nonreactive resistor is designed to conduct the greater of a current which corresponds to the cell voltage of the assigned battery cell and the current which is conducted by the preceding nonreactive resistor in the series connection.

Preferably, each of the nonreactive resistors has the same resistance value R. Preferably, the current corresponding to a cell voltage U is given by $(U-\Delta U)/R$, wherein $\Delta U$ is a predetermined voltage.

In a preferred embodiment, the device also comprises, for each of the multiplicity of nonreactive resistors an associated diode, an associated transistor and an associated reference voltage source, wherein in each case the anode of each diode is connectable to the positive pole of a battery cell assigned to the associated nonreactive resistor, the cathode of each diode is connected to a first connection of the associated nonreactive resistor, a second connection of each nonreactive resistor is connected to a first connection of the associated transistor, the control connection of each transistor is connected to the positive pole of the associated reference voltage source, the negative pole of each reference voltage source is connectable to the negative pole of a battery cell assigned to the associated nonreactive resistor, and the first connection of each nonreactive resistor except the first nonreactive resistor is connected to a second connection of the transistor associated with the preceding nonreactive resistor in the series connection. Preferably, the reference voltage sources are designed to provide in each case the same reference voltage, and the predetermined voltage $\Delta U$ is given by said reference voltage.

In a further preferred embodiment, the device also comprises for each of the multiplicity of nonreactive resistors an associated first transistor, an associated second transistor and an associated third transistor, wherein in each case the control connection of each first transistor is connected to a first connection of the associated second transistor, to the control connection of the associated second transistor and to the control connection of the associated third transistor, a first connection of each third transistor is connectable to the positive pole of the battery cell assigned to the associated nonreactive resistor, a second connection of each second transistor is connectable to the negative pole of the battery cell assigned to the associated nonreactive resistor, the control connections, which are connected together, of the first, second and third transistors are in each case connected via an associated additional nonreactive resistor to the first connection of the associated third transistor, a first connection of the first nonreactive resistor is connected to the first connection of the associated third transistor, a first connection of each nonreactive resistor except the first nonreactive resistor is connected to a second connection of the first transistor associated with the preceding nonreactive resistor in the series connection, a second connection of each nonreactive resistor is connected to a first connection of the associated first transistor and the second connection of each first transistor is connected to the second connection of the associated third transistor.

Preferably, the first transistors have a first base-emitter voltage, the second and third transistors have a second base-emitter voltage, and the predetermined voltage $\Delta U$ is given by the sum of the first base-emitter voltage and the second base-emitter voltage. The first base-emitter voltage and the second base-emitter voltage may be the same or different.

The device can be connected to a multiplicity of series-connected battery cells in such a way that a battery cell is assigned to each nonreactive resistor in accordance with the series connections. Preferably, the battery cells are lithium ion battery cells.

The disclosure also provides a battery management unit having a device according to the disclosure, a battery having a device according to the disclosure or a battery management unit according to the disclosure, and a motor vehicle, in particular an electric motor vehicle, having a battery according to the disclosure.

The disclosure further provides a method for measuring the maximum cell voltage among the cell voltages of a multiplicity of series-connected battery cells, wherein a first current which corresponds to the cell voltage of a first battery cell is induced, said first battery cell preceding all of the other battery cells in the series connection, and wherein further currents are induced, wherein each further current is assigned to a battery cell and wherein each further current is the greater of a current which corresponds to the cell voltage of the assigned battery cell and the current assigned to the battery cell which precedes the assigned battery cell in the series connection.

Advantageous developments of the disclosure are specified in the dependent claims and described in the description.

BRIEF DESCRIPTION OF THE DRAWINGS

Exemplary embodiments of the disclosure are described in more detail with reference to the drawings and the following description. In the drawings.

DETAILED DESCRIPTION

Figure 1:
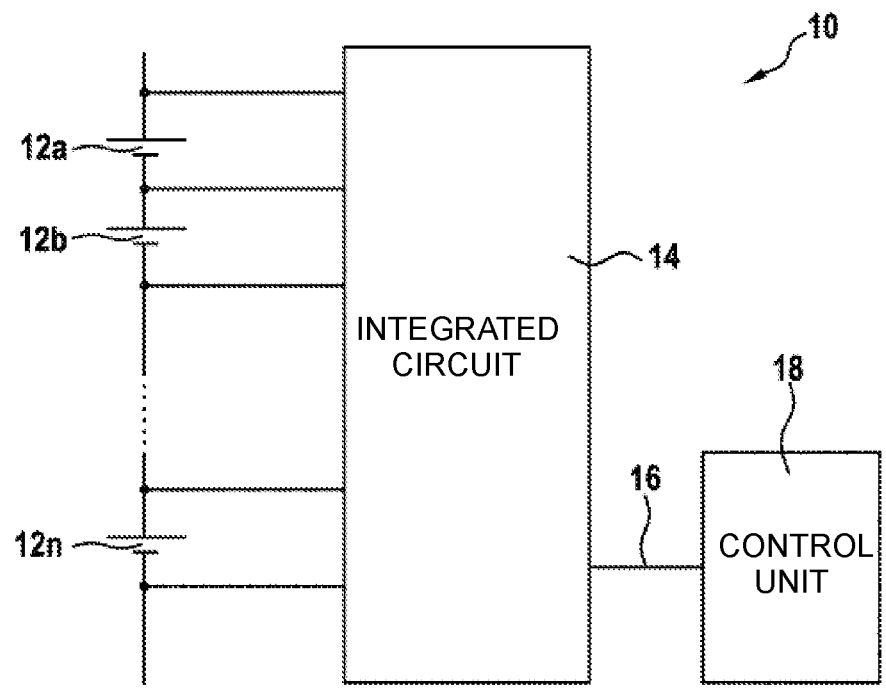
FIG. 1 shows a circuit diagram of a device for individually monitoring the voltage of battery cells in accordance with the prior art.
Figure 2:
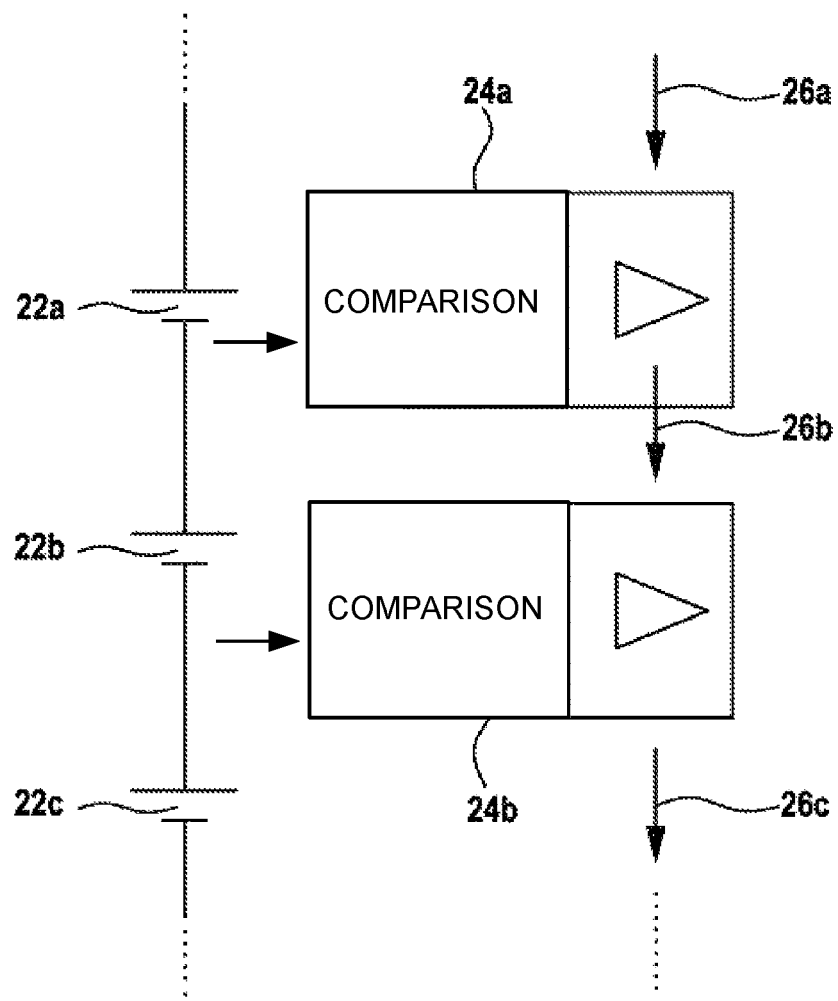
FIG. 2 shows a diagram for representing the principle of the disclosure.

FIG. 2 shows the principle according to which in accordance with the disclosure the maximum cell voltage among the cell voltages of a multiplicity of series-connected battery cells is ascertained. The battery to be monitored comprises a series of battery cells 22a, 22b, 22c, . . . . In a comparison step 24a, the cell voltage of the battery cell 22a is compared with a voltage that has been input at 26a, and the larger of the two voltages is output at 26b. Likewise, in a comparison step 24b, the voltage input at step 26b is compared with the cell voltage of the battery cell 22b, and the larger of the two voltages is output at 26c. The largest of the cell voltages of all battery cells 22a, 22b, 22c, . . . is determined by continuing this method for all battery cells.

Figure 3:
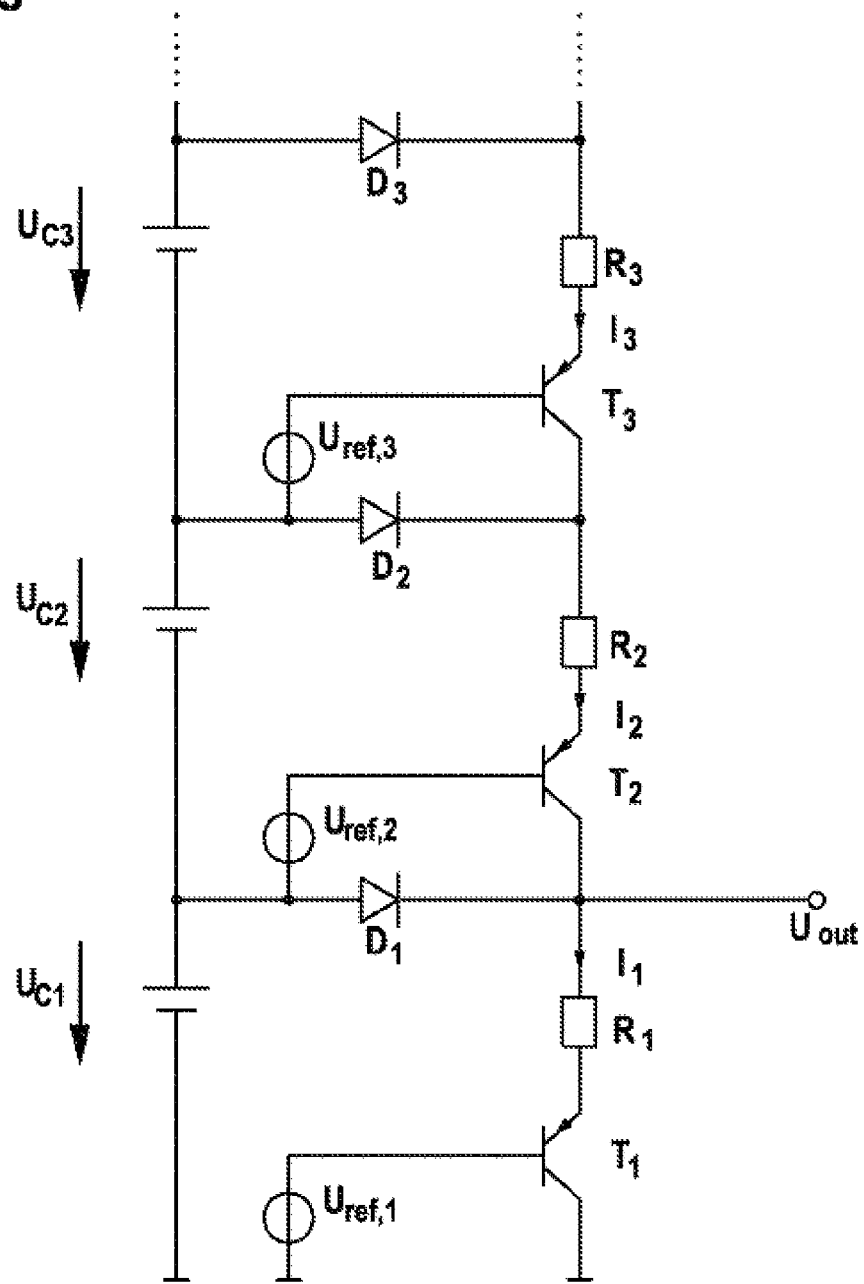
FIG. 3 shows a first exemplary embodiment of a device according to the disclosure for measuring a maximum cell voltage.

FIG. 3 shows a first exemplary embodiment of a device according to the disclosure for measuring the maximum cell voltage among the cell voltages of a multiplicity of series-connected battery cells. The cell voltages $U_{C1}$, $U_{C2}$, $U_{C3}$, . . . are tapped via diodes $D_1$, $D_2$, $D_3$, . . . that are considered as idealized diodes having infinitesimal forward voltage drop. By means of nonreactive resistors $R_1$, $R_2$, $R_3$, . . . and transistors $T_1$, $T_2$, $T_3$, . . . the cell voltages in each case are compared with reference voltage sources $U_{ref,1}$, $U_{ref,2}$, $U_{ref,3}$, . . . , wherein the transistors $T_1$, $T_2$, $T_3$, . . . are regarded as idealized transistors, for example PNP transistors having infinitesimal base-emitter voltage drop. The term 'base-emitter voltage of a transistor' is understood to refer to the relevant voltage that is present between the base and the emitter of the transistor when a current flows between the emitter and the collector; this voltage is approximately independent of the current flowing between the emitter and the collector. Ideally, all of the nonreactive resistors $R_1$, $R_2$, $R_3$, . . . have the same resistance value R, and all of the reference voltage sources $U_{ref,1}$, $U_{ref,2}$, $U_{ref,3}$, . . . provide the same voltage $U_{ref}$.

For the purposes of the following consideration, the cell having the cell voltage $U_{c3}$ is assumed to be the first cell of the battery; however, the results correspondingly apply to any number of cells. In the case of the described idealized properties of the components, the voltage $U_{c3}-U_{ref}$ is applied to the nonreactive resistor $R_3$, with the result that a current $I_3=(U_{c3}-U_{ref})/R$ flows. This current flows onwards through the nonreactive resistor $R_2$, with the result that at said resistor at least the voltage $R\ I_3=U_{c3}-U_{ref}$ drops off. If this voltage is greater than the difference $U_{c2}-U_{ref}$, then the diode $D_2$ becomes nonconductive, and only the current $I_2=I_3$ flows through the nonreactive resistor. However, if the voltage is smaller, in other words, if $U_{c3}-U_{ref}<U_{c2}-U_{ref}$ and therefore $U_{c2}>U_{c3}$, then the diode $D_2$ becomes conductive, and the voltage $U_{c2}-U_{ref}$ is present at the nonreactive resistor $R_2$, with the result that a current $I_2=(U_{c2}-U_{ref})/R$ flows. In both cases, a current $I_2$ consequently flows, which current corresponds to the greater of the two voltages $U_{c2}$ and $U_{c3}$, in other words $I_2=(\max(U_{c2}, U_{c3})-U_{ref})/R$.

The same applies for the diode $D_1$ and the nonreactive resistor $R_1$, with the result that the current $I_1=(\max(U_{c1}, \max(U_{c2}, U_{c3}))-U_{ref})\ R=(\max(U_{c1}, U_{c2}, U_{c3})-U_{ref})/R$ flows through the nonreactive resistor $R_1$ and the voltage $\max(U_{c1}, U_{c2}, U_{c3})-U_{ref}$ drops off at said nonreactive resistor. As a result, the sought maximum cell voltage $\max(U_{c1}, U_{c2}, U_{c3})$ can be tapped at $U_{out}$.

Figure 4:
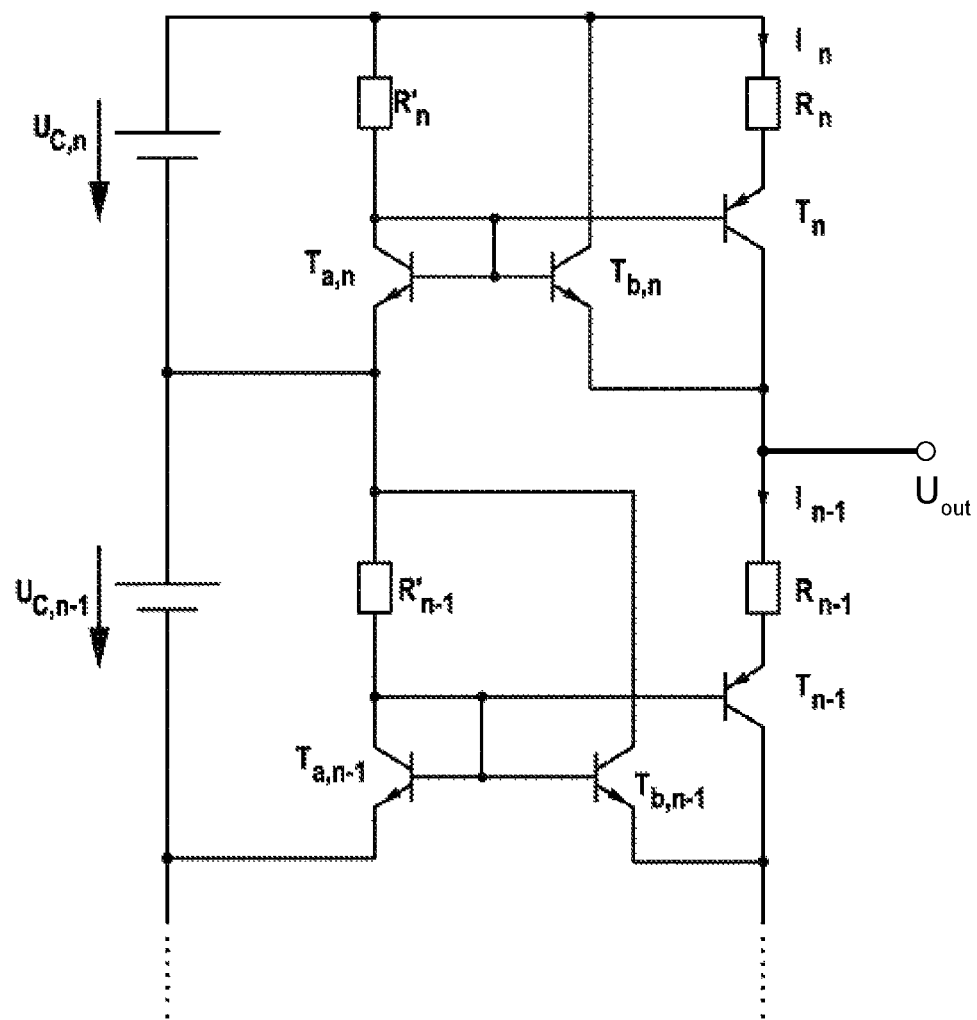
FIG. 4 shows a second exemplary embodiment of a device according to the disclosure for measuring a maximum cell voltage.

FIG. 4 shows a second exemplary embodiment of a device according to the disclosure for measuring the maximum cell voltage among the cell voltages of a multiplicity of series-connected battery cells, wherein the non-ideal properties of the components are taken into account. Here, instead of the diodes $D_1$, $D_2$, $D_3$, . . . , in each case two additional transistors $T_{a,n}$, $T_{a,n-1}$, . . . and $T_{b,n}$, $T_{b,n-1}$, . . . and an additional nonreactive resistor $R'_n$, $R'_{n-1}$, . . . are provided for each battery cell. In this case, all of the transistors $T_{a,n}$, $T_{a,n-1}$, . . . and $T_{b,n}$, $T_{b,n-1}$, . . . are ideally constructionally identical to one another and at the same temperature, with the result that they have identical characteristics; likewise, the transistors $T_n$, $T_{n-1}$, . . . are constructionally identical to one another.

The collectors and bases of the transistors $T_{a,n}$, $T_{a,n-1}$, . . . are connected in each case and the cell voltages $U_{c,n}$, $U_{c,n-1}$, . . . are applied to the transistors $T_{a,n}$, $T_{a,n-1}$, . . . via the additional nonreactive resistors $R'_n$, $R'_{n-1}$, . . . . Thus, the transistors $T_{a,n}$, $T_{a,n-1}$, . . . are conductive independently of the currents flowing in the nonreactive resistors $R_n$, $R_{n-1}$, . . . , and in each case the base-emitter voltage $U_{BE}$ drops between base and emitter. In addition, the collectors and bases of the transistors $T_{a,n}$, $T_{a,n-1}$, . . . are in each case connected to the bases of the transistors $T_n$, $T_{n-1}$, . . . . As a result of this, the transistors $T_n$, $T_{n-1}$, . . . are also conductive as long as the sum of two base-emitter voltages does not exceed the cell voltage.

Thus, the voltage $U_n=U_{c,n}-(U'_{BE}+U_{BE})$ is present across the nonreactive resistor $R_n$, wherein $U'_{BE}$ is the base-emitter voltage of the transistors $T_{a,n}$, $T_{a,n-1}$, . . . and $T_{b,n}$, $T_{b,n-1}$, . . . and $U_{BE}$ is the base-emitter voltage of the transistors $T_n$, $T_{n-1}$, . . . . Correspondingly, the current $U_n/R$ flows through the nonreactive resistor $R_n$. This current flows onward through the nonreactive resistor $R_{n-1}$, with the result that at least the voltage $U_n$ drops across said nonreactive resistor $R_{n-1}$.

The voltage $U_{n-1}$ across the resistor $R_{n-1}$ results from the sum of the cell voltage $U_{c,n-1}$ and the voltages which are present in each case between base and emitter of the transistors $T_{a,n}$, $T_{b,n}$, $T_{n-1}$ and $T_{a,n-1}$. In this case, the voltages associated with $T_{a,n}$ and $T_{a,n-1}$ cancel each other out, since said transistors are conductive and constructionally identical and the associated voltages come into the sum with opposite mathematical signs. If $U_{c,n-1} < U_{c,n}$ and, as a result, $U_{c,n-1} < R\ I_n + (U'_{BE} + U_{BE})$, then the transistor $T_{b,n}$ becomes nonconductive and only the current $I_{n-1} = I_n$ flows through the nonreactive resistor $R_{n-1}$ at a corresponding voltage $U_{n-1} = U_n$. Conversely, if $U_{c,n-1} < U_{c,n}$, then the transistor $T_{b,n}$ becomes conductive and the voltage $U_{n-1} = U_{c,n-1} - (U'_{BE} + U_{BE})$ drops across the nonreactive resistor $R_{n-1}$. Therefore, in both cases, $U_{n-1} = \max(U_{c,n-1}, U_{c,n-1}) - (U'_{BE} + U_{BE})$. This correspondingly applies for the further stages of the circuit, such that the voltage $\max(U_{c,n-1}, U_{c,n-1}, \ldots, U_{c1}) - (U'_{BE} + U_{BE}) + (U'_{BE} + U_{BE}) = \max(U_{c,n-1}, U_{c,n-1}, U_{c1})$, that is to say the sought maximum cell voltage, is present between the ground and the upper connection of the nonreactive resistor $R_1$ (not shown), it being possible for said maximum cell voltage to be tapped there and used for monitoring the battery.

The above-described device can be used as part of a battery management unit which monitors the maximum cell voltage of the battery cells of a battery and protects the battery cells against overloading. A battery management unit of this type can be used as part of a battery, in particular a battery used in a motor vehicle.

The invention claimed is:

1. A circuit for generating a maximum voltage level from one battery cell in a plurality of battery cells comprising:
   a reference voltage source configured to generate a predetermined reference voltage;
   a first stage connected to a first battery cell in a battery, the first stage comprising:
   a first diode;
   a first resistor;
   a voltage output connected to a first terminal of the first resistor; and
   a first transistor, wherein an anode of the first diode is connected to a first terminal of the first battery cell;
   a cathode of the first diode is connected to the first terminal of the first resistor;
   a second terminal of the first resistor is connected to an emitter of the first transistor;
   the voltage reference source is connected to a base of the first transistor; and
   a second terminal of the first battery cell and a collector of the first transistor are connected to ground;
   a second stage connected to a second battery cell in the battery and the first stage, a second terminal of the second battery cell being connected in series to the first terminal of the first battery cell, the second stage comprising:
   a second diode;
   a second resistor; and
   a second transistor, wherein an anode of the second diode is connected to a first terminal of the second battery cell;
   a cathode of the second diode is connected to a first terminal of the second resistor;
   a second terminal of the second resistor is connected to an emitter of the second transistor;
   the voltage reference source is connected to a base of the second transistor and the anode of the first diode from the first stage;
   the second terminal of the second battery cell is connected to the anode of the first diode in the first stage; and
   a collector of the second transistor is connected to the cathode of the first diode and the first terminal of the first resistor in the first stage; and
   the voltage output being configured to generate a first voltage level of the first battery cell in response to the first voltage level of the first battery cell exceeding a second voltage level of the second battery cell or a second voltage level of the second battery cell in response to the second voltage level of the second battery cell exceeding the first voltage level of the first battery cell.

2. The circuit of claim 1 further comprising:
   a third stage connected to the second stage and a third battery cell in the battery, a second terminal of the third battery cell being connected in series to the first terminal of the second battery cell, the third stage comprising:
   a third diode;
   a third resistor; and
   a third transistor: wherein an anode of the third diode is connected to a first terminal of the third battery cell; a cathode of the third diode is connected to a first terminal of the third resistor; a second terminal of the third resistor is connected to an emitter of the third transistor; the voltage reference source is connected to a base of the third transistor and the anode of the second diode from the second stage; the second terminal of the third battery cell is connected to the anode of the second diode in the second stage; and a collector of the third transistor is connected to the cathode of the second diode and the first terminal of the second resistor in the second stage; and
   the voltage output being further configured to generate a first voltage level of the third battery cell in response to the first voltage level of the third battery cell exceeding the first voltage level of the first battery cell and the second voltage level of the second battery cell.

3. The circuit of claim 1 wherein the first resistor has a first predetermined resistance value and the second resistor has the first predetermined resistance value.

4. The circuit of claim 1 wherein the circuit is incorporated in a battery management unit.

5. The circuit of claim 1 wherein the plurality of battery cells are incorporated in a battery.

6. A circuit for generating a maximum voltage level from one battery cell in a plurality of battery cells comprising:
   a first stage connected to a first battery cell in a battery; the first stage comprising:
   a first resistor;
   a second resistor;
   a voltage output connected to a first terminal of the second resistor;
   a first transistor;
   a second transistor; and
   a third transistor, wherein a first terminal of the first resistor is connected to a first terminal of the first battery cell and to a collector of the second transistor;
   a second terminal of the first resistor, a base of the first transistor, a base of the second transistor, and a base of the third transistor are connected together;
   a second terminal of the second resistor is connected to an emitter of the third transistor;

a second terminal of the first battery cell is connected to an emitter of the first transistor; and the emitter of the first transistor, an emitter of the second transistor, and a collector of the third transistor are connected to around;

a second stage connected to a second battery cell in the battery and the first stage, the second stage comprising:

a third resistor;

a fourth resistor;

a fourth transistor;

a fifth transistor; and a sixth transistor, wherein a first terminal of the third resistor is connected to a first terminal of the second battery cell, the first terminal of the fourth resistor, and to a collector of the fifth transistor;

a second terminal of the third resistor, a base of the fourth transistor, a base of the fifth transistor, and a base of the sixth transistor are connected together;

a second terminal of the fourth resistor is connected to an emitter of the sixth transistor;

a second terminal of the second battery cell, an emitter of the fourth transistor, the first terminal of the first battery cell, the first terminal of the first resistor, and the collector of the second transistor are connected together;

and an emitter of the fifth transistor, a collector of the sixth transistor and the first terminal of the second resistor are connected together; and the voltage output being configured to generate a first voltage level of the first battery cell in response to the first voltage level of the first battery cell exceeding a first voltage level of the second battery cell or a first voltage level of the second battery cell in response to the first voltage level of the second battery cell exceeding the first voltage level of the first battery cell.

7. The circuit of claim 6 wherein the first transistor, the second transistor, the fourth transistor, and the fifth transistor are NPN transistors and the third transistor and the sixth transistor are PNP transistors.

8. The circuit of claim 6 wherein the second resistor has a first predetermined resistance value and the fourth resistor has the first predetermined resistance value.

9. The circuit of claim 6 wherein the circuit is incorporated in a battery management unit.

10. The circuit of claim 6 wherein the plurality of battery cells are incorporated in a battery.

* * * * *

UNITED STATES PATENT AND TRADEMARK OFFICE
CERTIFICATE OF CORRECTION

PATENT NO. : 9,465,082 B2
APPLICATION NO. : 14/233746
DATED : October 11, 2016
INVENTOR(S) : Stefan Butzmann Page 1 of 1

It is certified that error appears in the above-identified patent and that said Letters Patent is hereby corrected as shown below:

In the Claims

In Column 6, Lines 50-53, of Claim 6 should read:

6. A circuit for generating a maximum voltage level from one battery cell in a plurality of battery cells comprising:
    a first stage connected to a first battery cell in a battery,
        the first state comprising:

In Column 7, Lines 3-5, of Claim 6 should read:

the emitter of the first transistor, an emitter of the second
    transistor, and a collector of the third transistor are
    connected to ground;

Signed and Sealed this
Seventh Day of February, 2017

Michelle K. Lee
*Director of the United States Patent and Trademark Office*